(12) United States Patent
Boettcher

(10) Patent No.: US 6,306,748 B1
(45) Date of Patent: Oct. 23, 2001

(54) BUMP SCRUB AFTER PLATING

(75) Inventor: Mathias Boettcher, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/148,193

(22) Filed: Sep. 4, 1998

(51) Int. Cl.[7] .................................................. H01L 21/44
(52) U.S. Cl. ........................ 438/612; 438/614; 438/692; 438/942
(58) Field of Search .................................. 438/612, 613, 438/614, 942, 959, 692

(56) References Cited

U.S. PATENT DOCUMENTS 5,903,058 * 5/1999 Akram .

FOREIGN PATENT DOCUMENTS

409252003 * 9/1997 (JP) .

OTHER PUBLICATIONS

IBM Tech. Discl. Bull. vol. 35, No. 2, p. 19, Jul. 1992.*

* cited by examiner

Primary Examiner—Caridad Everhart

(57) ABSTRACT

A plurality of uniform bumps are formed on a semiconductor device by forming a mask onto the surface of the semiconductor device with openings in the mask that correspond to the electrical contact pads on the surface of the semiconductor device. Solder or other conductive material is deposited on the pads. A rate of solder or other conductive material deposition which may not give a uniform thickness of solder or other conductive material across the surface of the wafer may be used. Solder or other conductive material is deposited until each opening in the mask is filled with solder or other conductive material. Next, the mask and solder or other conductive material balls formed are scrubbed until the mask and the soldier balls reach a substantially uniform height. The openings formed in the mask have substantially the same footprint or area associated with each pad. Since the solder or other conductive material balls are at the same height, the solder or other conductive material balls have approximately the same volume. The next step is to remove the mask and plating base metallization using a wet or dry etching process. If the material is solder, the next step is to reflow the solder to form substantially uniform solder balls or bumps on each pad across the wafer. The wafer is then diced to form individual chips having bumps which are uniform in height and volume.

13 Claims, 6 Drawing Sheets

BUMP SCRUB AFTER PLATING

FIELD OF THE INVENTION

The invention relates to semiconductor device assemblies, and more particularly to techniques for forming external connections with raised ball bump type contacts on an exterior surface of a semiconductor package.

BACKGROUND OF THE INVENTION

The semiconductor industry has seen tremendous advances in technology in recent years which have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

In the past the die and package were first attached and then were wire bonded. The wire bonding procedure is simple in concept. A thin (0.7 to 1.0 mil) wire is first bonded to the chip bonding pad and spanned to the inner lead of the package lead frame. The third action was to bond the wire to the inner lead. Lastly, the wire is clipped and the entire process repeated at the next bonding pad. While simple in concept and procedure, wire bonding was critical because of the precise wire placement and electrical contact requirements. In addition to accurate placement, each and every wire must make a good electrical contact at both ends, span between the pad and the inner lead in a prescribed loop without kinks and be at a safe distance from neighboring lead wires. Wire loops in these packages are 8 to 12 mils, while those of ultrathin packages are 4 to 5 mils. The distance between adjacent wires is called the pitch of the bonding. Wire bonding has been done with either gold or aluminum wires. Both types of wire are highly conductive and ductile enough to withstand deformation during the bonding steps and remain strong and reliable.

Wire bonding between a die and a package has several problems. One problem is that a wire bond attachment to a die limits the number of pads and placement of the pads on the die. In addition, minimum height limits are imposed by the required wire loops. Another problem is that there is a chance of electrical performance problems or shorting if the wires come too close to each other. The wire bonds also require two bonds and must be placed one-by-one and there are resistances associated with each bond. The wires are also relatively long.

To increase the number of pad sites available for a die and to address the problems stated above and other problems, dies were provided with deposited metal bumps on each bonding pad. The bonding pads were also moved to the side of the die nearest the transistors and other circuit devices formed in the die. As a result, the electrical path to the pad is shorter. Connection to the package is made when the chip is flipped over and soldered. As a result, the dies are commonly called flip chips in the industry. Each bump connects to a corresponding package inner lead. The packages which result are lower profile and have lower electrical resistance and a shortened electrical path. The plurality of ball-shaped conductive bump contacts (usually solder, or other similar conductive material) are typically disposed in a rectangular array. The packages are occasionally referred to as "Ball Grid Array" (BGA) or "Area Grid Array" packages.

A typical BGA package is characterized by a large number of solder balls disposed in an array on a surface of the package. It is not uncommon to have hundreds of solder balls in an array. The BGA package is assembled to a matching array of conductive pads. The pads are connected to other devices within a substrate or circuitry on a circuit board. Heat is applied to reflow the solder balls (bumps) on the package, thereby wetting the pads on the substrates and, once cooled, forming electrical connections between the package and the semiconductor device contained in the package and the substrate.

The introduction of flip chips and Ball Grid Array (BGA) packages to the semiconductor industry have brought several new manufacturing and assembly challenges. One of the more significant problems is finding an efficient, cost-effective technique for applying the solder ball contacts to the die or package surface. The die surface is usually formed from an electrically insulating material, usually silicon, with a pattern of metallized pads disposed thereupon for connecting to the package. The package is attached to an external system via a circuit board.

One of the larger challenges is keeping the height of solder ball contacts substantially uniform. This is a critical factor for successful attachment of flip chips to BGA-type packages. If one or more balls are significantly shorter than others it becomes highly likely that these smaller (shorter) contacts will completely miss their mating contact pads and will fail to form an electrical connection between the semiconductor device and the package. Another challenge is to keep the volume of solder associated with each pad essentially the same. If one pad is provided with too much solder, it may contact a neighboring pad on the die. This is an unwanted contact or short to another pad on the die.

In semiconductor manufacturing, a wafer is processed to form many individual chips (also known as dies). The wafer is diced to form the individual chips. Currently, bumps are formed on the chips or dies when they are still in wafer form. One of the final steps in the semiconductor manufacturing process is to form the actual pads on the surface of the chips. If the chips are flip chips, solder is then deposited on each pad. As mentioned above the amount per pad must be consistent so that a consistent set of bumps are formed when the solder is reflowed. Currently, solder is deposited at a rate of 0.6–0.8 micrometers/minute so that solder is deposited consistently on each pad across the wafer. Solder can be deposited at much faster rates, however, at the higher rates, depositing a consistent amount of solder on each pad is not possible. Differing amounts of solder on each pad may produce a short or an open as discussed above.

The slow deposition rate of solder onto the pads of each chip on a wafer is an obstacle to higher manufacturing rates. Many current manufacturing processes have slow throughput, and their deposition of solder onto the wafer can be a bottleneck in the manufacturing process.

As more and more capability is being designed into electronic devices, such as memory chips and microprocessor chips, the number of input/output elements or pads are being vastly increased. Therefore, a controlled process is also needed.

SUMMARY OF THE INVENTION

According to one example embodiment of the present invention, a plurality of uniform bumps are formed on a semiconductor device by forming a mask onto the surface of plating metal (bump limitation metallization) with openings in the mask that correspond to the electrical contact pads on the surface of the semiconductor device. Solder is deposited on the pads. A rate of solder deposition which may not give a uniform thickness of solder across the surface of the wafer may be used. Solder is deposited until each opening in the mask is filled with solder. Next, the mask and solder pads formed are scrubbed until the mask and the solder pads reach a substantially uniform height or until the mask and solder pads reach a defined or selected thickness. The openings formed in the mask have substantially the same footprint or area associated with each pad. Since the solder pads are at the same height, the solder pads have approximately the same volume. The next step is to remove the mask, using a wet or dry etching process to structure the base limitation metallization ("BLM"). The next step is to reflow the solder to form substantially uniform solder balls or bumps on each pad across the wafer. The wafer is then diced to form individual chips having bumps which are uniform in height and volume.

According to another example embodiment, the solder balls are scrubbed after depositing, and there is no need to use a slower solder deposition rate at which solder is laid down or deposited at a uniform thickness across the wafer. The electroplating can be done at a rate of 3.0–5.0 micrometers/minute. This is approximately 2 to 3 times the plating rate that results in a uniform thickness of solder. As a result, the processing time for the wafer devoted to the electroplating process can be lessened. Throughput for adding solder bumps to electrical contact pads can be improved and uniformity of the bumps can be assured. This process can also be adapted to any pattern of solder bumps and can also be adapted to make solder bumps for densely packed contacts which will come in the future.

BRIEF DESCRIPTION OF THE DRAWINGS

The following detailed description can best be understood when read in conjunction with the following drawings, in which.

Figure 1:
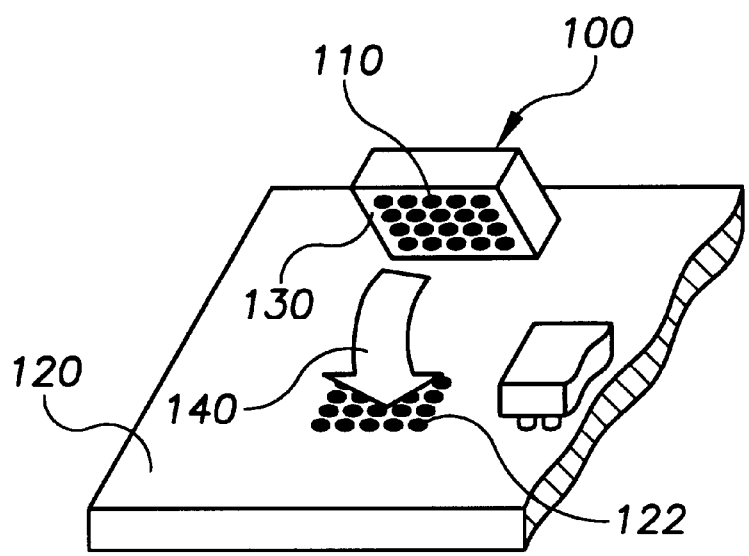
FIG. 1 shows a perspective view of a flip chip, consistent with the invention described herein, having solder bumps being attached a surface.

While the invention is amenable to various modifications and alternative forms, specifics thereof have been shown by way of example in the drawings and will be described in detail. It should be understood, however, that the intention is not to limit the invention to the particular embodiment described. On the contrary, the invention is to cover all modifications, equivalents, and alternatives falling within the spirit and scope of the invention as defined by the appended claims.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

FIG. 1 shows a perspective view of a flip chip 100 having solder bumps 110 being attached a surface 120, implemented in accordance with the present invention. The flip chip 100 has a number of circuit devices formed therein. The circuit devices are located near the bumps 110. Generally located below each of the bumps is a pad (shown in FIGS. 4A–4F). The pads and bumps 110 formed on each pad are located on the interconnect surface 130 of the flip chip 100. The interconnect surface 130 can be on the parallel surface of the chip, although this is generally not done since the vias to the devices are shorter and the electrical paths are also shorter when the pads are placed on the surface closest to the epitaxial layer of the chip. The arrow 140 in FIG. 1 shows the direction that the chip 100 is rotated to properly position the chip over the surface 120. It should be noted that surface 120 has a corresponding number of bumps 122 thereon.

Figure 2:
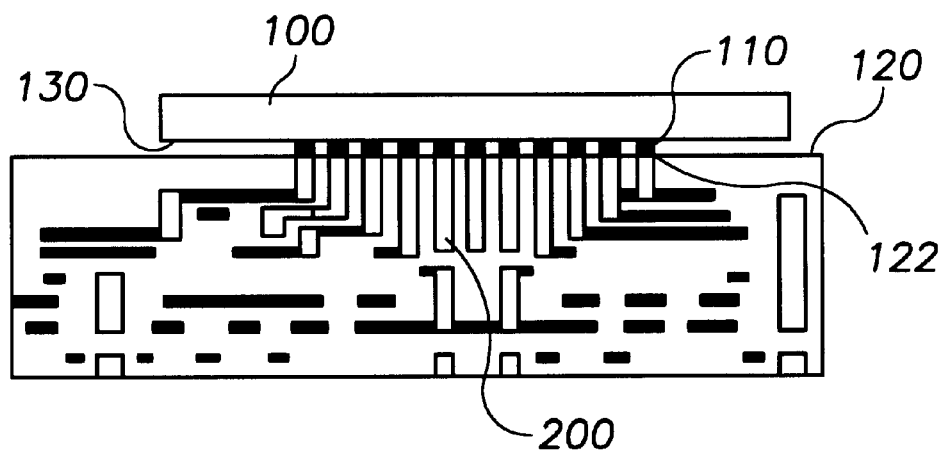
FIG. 2 shows a cross sectional view of a flip chip, consistent with the invention described herein, having solder bumps attached a surface.

FIG. 2 shows a cross sectional view of a flip chip 100 after having been attached to the surface 120, implemented in accordance with the present invention. The surface 120 can be a packaging device for the flip chip 100. The surface 120 includes circuitry 200. If the surface is a packaging device, the circuitry 200 carries signals to an information handling system formed of various semiconductor devices and other devices. The surface 120 can also be associated with another semiconductor device.

Figure 3:
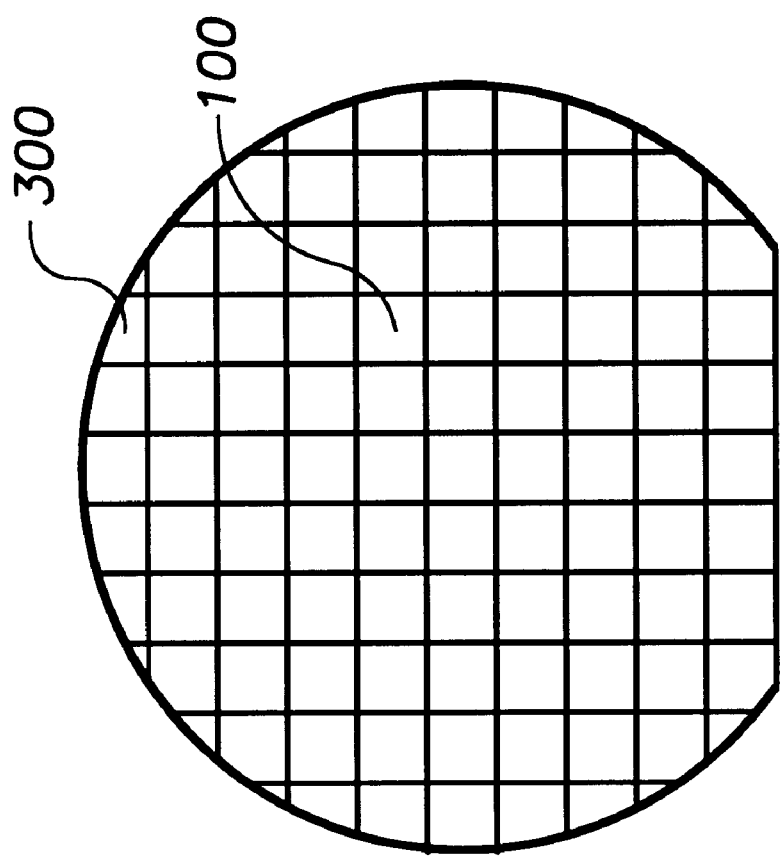
FIG. 3 shows a top view of a wafer, consistent with the invention described herein.

FIG. 3 shows a top view of a wafer 300, implemented in accordance with the present invention. A wafer 300 is generally made of very pure silicon. The wafer undergoes many process steps to form a plurality of layers of semiconductor devices. The process steps include the basic operations of layering, patterning, doping and heating. The end result is a wafer having many substantially identical chips 100 or die. One of the last process steps for the wafer 300 is to provide pads (shown in FIGS. 4A–4F) and to form solder bumps 110 on the pads of all the chips 100 shown on the wafer 300. The bumps 110 are formed by depositing solder on each of the pads on the wafer. Each chip is represented as a rectangle or square on the wafer 300. Each chip 100 in the wafer 300 can have a large number of pads. A wafer 300 full of chips 100 has many more pads to be covered with bumps 100. Of course, as time goes on the number of electronic transistors and other circuit components that can be formed in a chip will increase which in turn will increase the number of input/output pads for each chip 100. After all the process steps are complete and the individual chips are tested, the wafer 300 is diced or cut along the lines shown to produce the individual chips 100.

FIGS. 4A–4F show cross-sectional views of successive process steps in a process for forming solder balls on the pads 400 of a number of chips on a wafer 300. Although only two pads are shown, it should be remembered that the process is used to form solder balls on a multiplicity of pads 400 across the surface of a wafer 300. It should also be noted that the process could be readily adapted for forming solder balls on other surfaces such as the surface of a ball grid array (BGA) package which holds an individual chip 100.

Figure 4A:
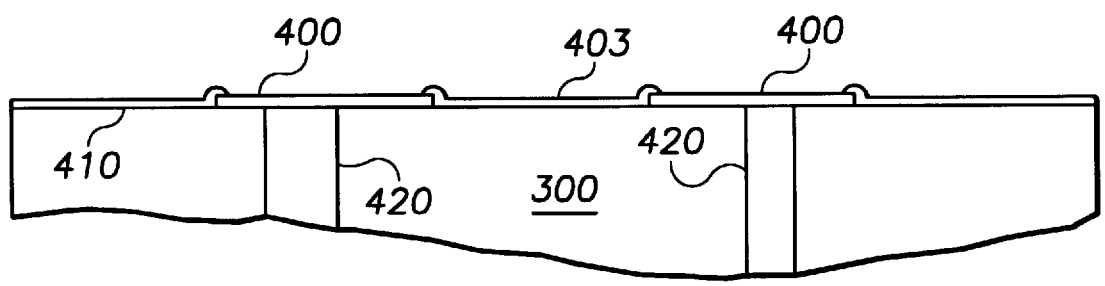
FIGS. 4A–4F show cross-sectional views of successive process steps in a process for forming solder balls on the pads of dies.
Figure 4B:
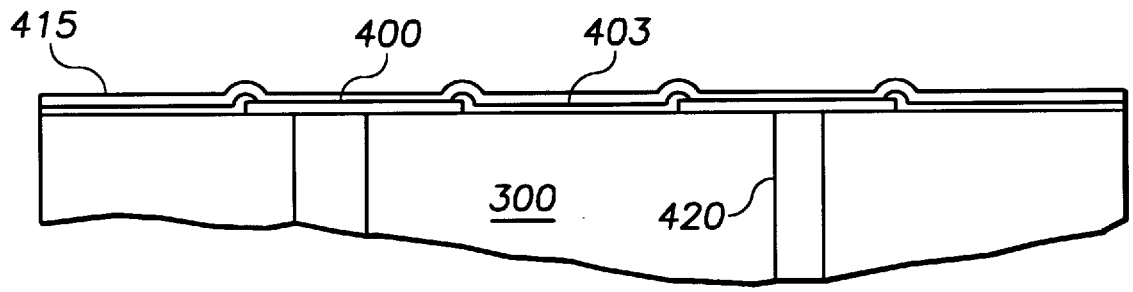

Now turning to FIG. 4A, a wafer 300 with a plurality of electrical contact pads 400 and die passivation 403 formed on the surface 410 is used as the starting material for the high speed bump plating/forming process. Step 1, shown in FIG. 4B, is to deposit metal onto the surface of the wafer that is used to form the bond limiting metallization areas 415. Sputtering, evaporation, or other methods may be used to accomplish the deposition.

Figure 4C:
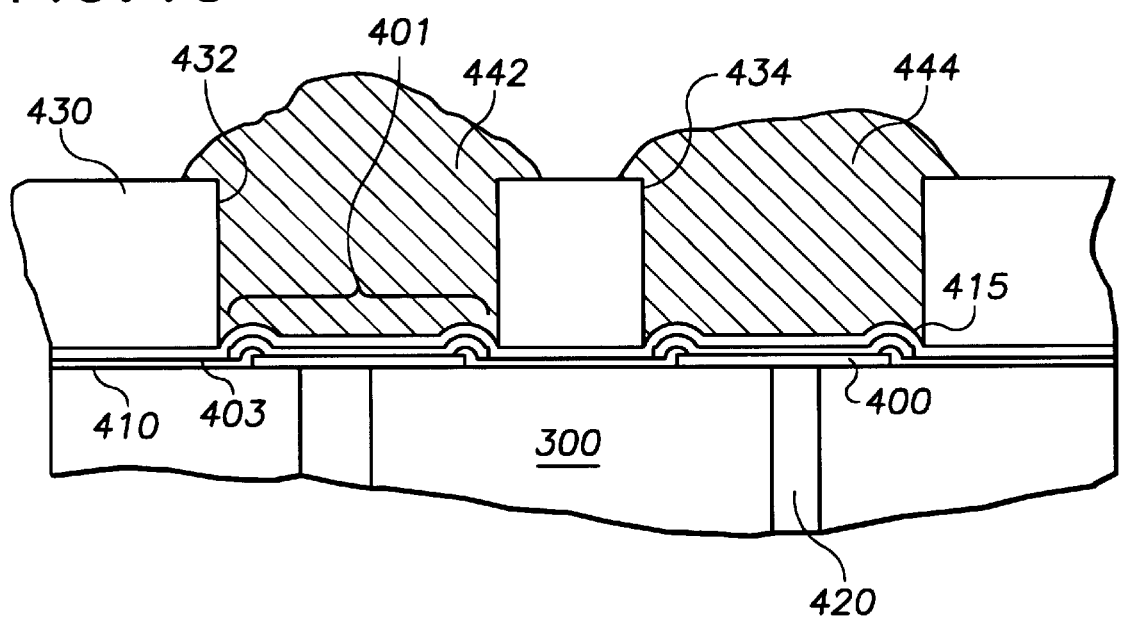

FIG. 4C shows the result of Steps 2 and 3. A mask 430 for solder is formed on the surface 410 of the wafer 300 in Step 2. The mask 430 is formed with a wet or dry material. The mask 430 has a thickness in the range of 20–100 microns. Openings 432 and 434 are formed in the mask 430, over sites 401. The openings 432 and 434 correspond to the electrical contact pads 400. In other words, at the surface 410 of the wafer within the openings 432 and 434 is a pad 400.

In Step 3, a tin/lead solder 442 is plated within the opening 432, as in FIG. 4C. It should be noted that the solder pads 442 and 444 are of different heights. Each of the solder pads 442 and 444 fills the opening 432 and 434 in the mask 430, as shown in FIG. 4C. The solder pads 442 and 444 form a slightly domed top over the mask 430. It should be noted that the solder can be deposited to a height where the openings 432 and 434 are not full, yet the solder is higher than a defined height. In this example embodiment, solder can be deposited at a more rapid rate when compared to methods where the rate at which solder is deposited is limited to a rate where a uniform thickness must result after the solder depositing step. As shown in FIG. 4C, the solder is electroplated onto the wafer 300 having the openings 432 and 434 therein. The electroplating can be done at a rate of 3–5 micrometers/minute. This is approximately 2 to 3 times the plating rate that results in solder pads having a uniform thickness of solder. As a result, the time devoted to electroplating in the process for forming solder balls on a wafer can be lessened. Throughput for depositing solder onto the wafer to form pads 442 and 444 can be improved. Improvement in throughput for depositing solder onto the wafers also improves the throughput for the entire process.

Figure 4D:
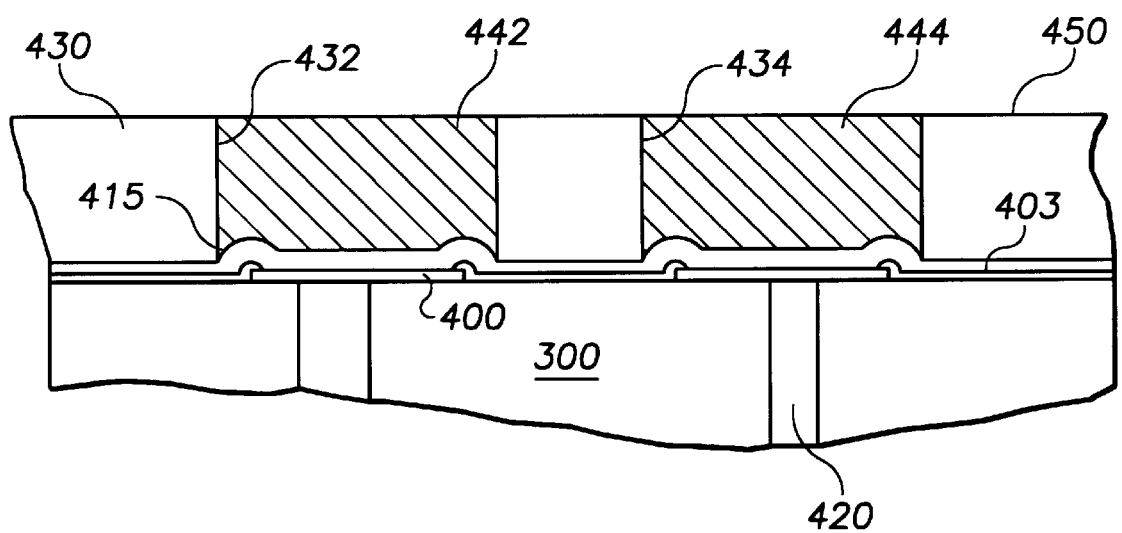

Step 4 is to scrub the wafer after electroplating the solder, as shown in FIG. 4D. By scrubbing the wafer, the pads 442 and 444 are scrubbed to a uniform height. The mask 430 is also scrubbed to the same uniform height. It should be noted that even if the electroplating of solder did not result in the openings 432 and 434 in the mask not overflowing with solder, the end result of the step shown in FIG. 4D is that the mask 430 and the pads 442 and 444 are scrubbed to the same height. Since the openings 432 and 434 have the same area or footprint with respect to the pad 400, the solder associated with each pad 400 in each of the openings 432 and 434 have substantially the same volume. The bumps 442 and 444 are scrubbed with a commercially available tool for chemical and mechanical polishing, commonly referred to as a CMP. The bumps are scrubbed so that a uniform height surface 450 is formed.

Figure 4E:
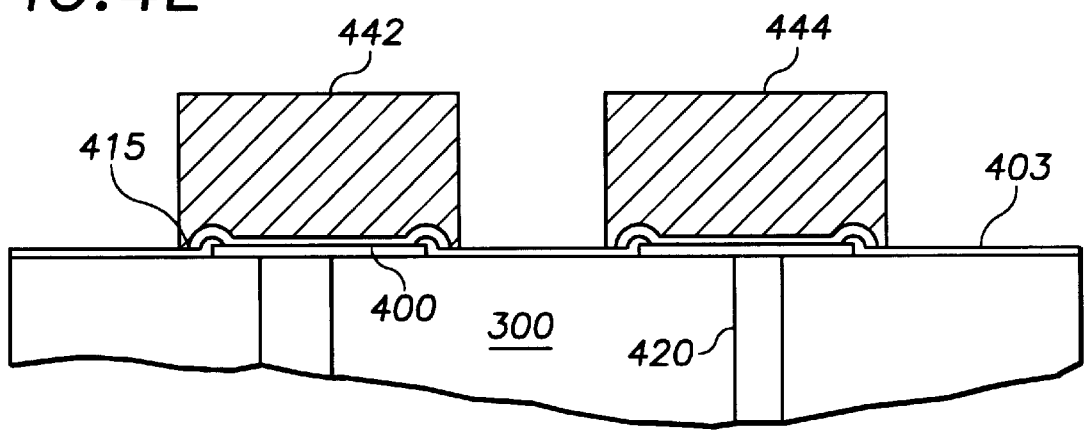
Figure 4F:
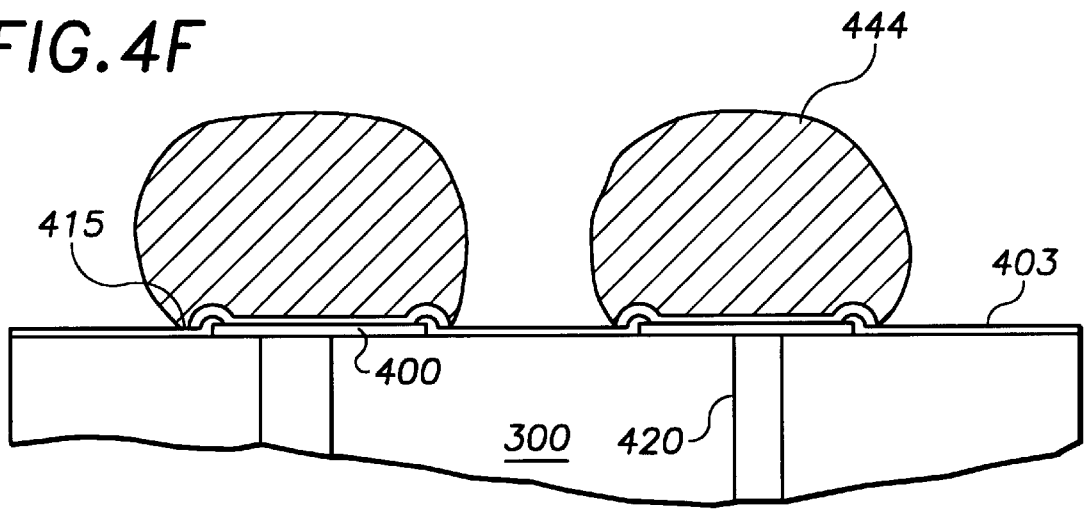

In Step 5, the mask 430 is then stripped or removed and the plating base is etched to leave substantially uniform solder pads 442 and 444, as shown in FIG. 4E. According to one approach consistent with the present invention, stripping away the mask 430 may also strip away the bond limiting metallization areas 415 beneath the mask material 430. The final step, shown by FIG. 4F, is to reflow the solder. Heat is applied to reflow the solder balls 442 and 444 on the surface of the wafer, thereby wetting the pads 400 on the surface of the wafer 300. Surface tension of the solder forms solder balls 442 and 444 into the bumps 110. Each bump 110 is uniform since the scrubbing process assured that there was substantially the same volume associated with each pad 400.

Further processing steps include cutting or dicing the wafer 300 into individual chips 100. These further processing steps are conventional and need not be repeated herein. Likewise various ones of the processing steps disclosed herein may be combined with other steps as is apparent to those skilled in the art.

The above example embodiments of the present invention can include numerous variations. For instance, the chips on the wafer 300 can be made of various sizes and various machines can be used to scrub the solder balls 442 and 444. In addition, different types of deposition can also be used to deposit solder into the openings 432 and 434 of the mask 430. In addition, the pattern of the bumps 110 on each chip may be changed. In addition, this invention is not limited to forming bumps on wafers 300 but can also be implemented to form bumps on any package requiring a large number of bump type electrical contacts of uniform size. Additionally, the bumps may be of material other than solder that is usable in an electrical device.

Figure 5:
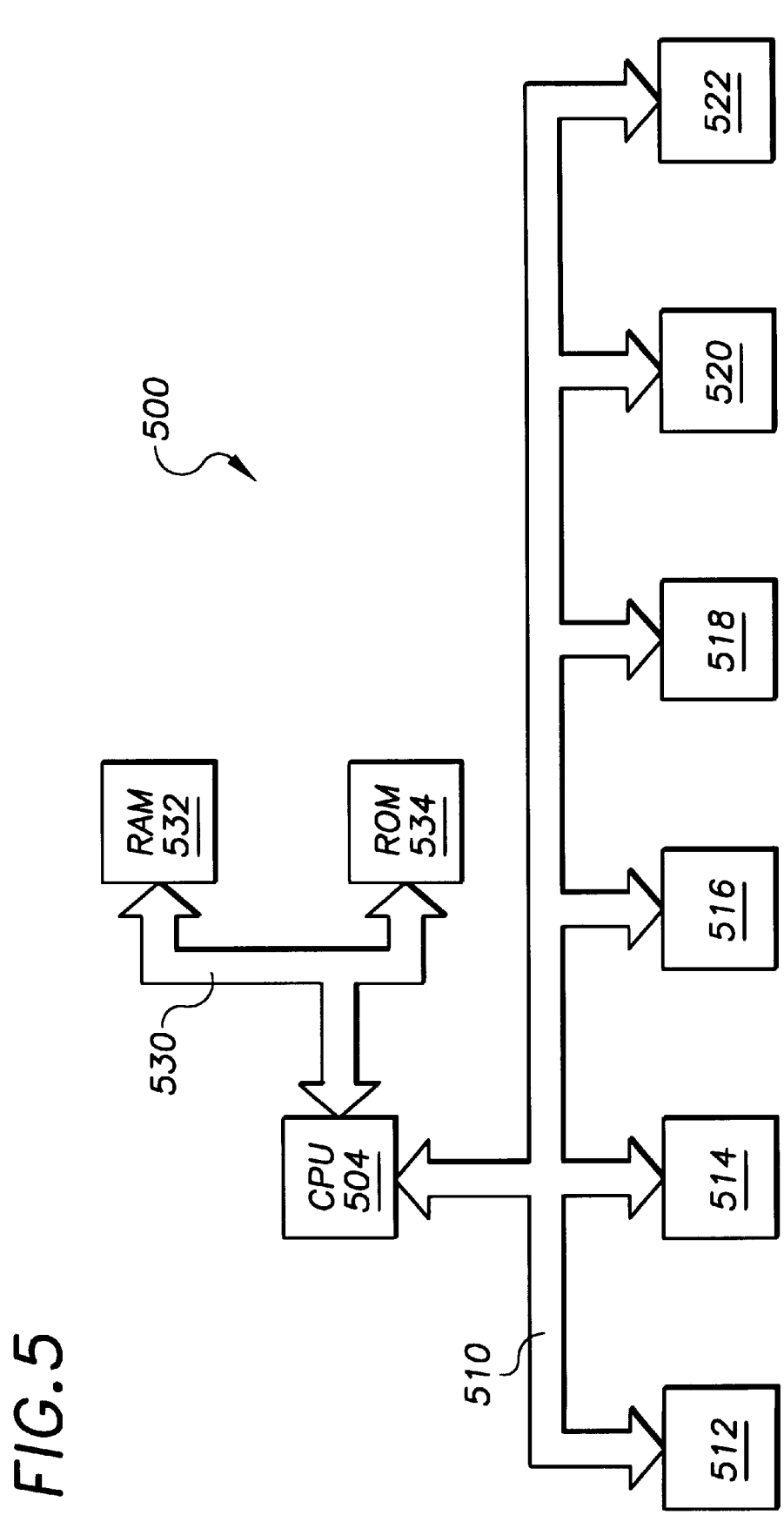
FIG. 5 is a schematic of an information handling system.

Advantageously, the invention is well-suited for use on any semiconductor device such as chips having microprocessors or memory therein. The chips formed by this process can be used in any electronic system, such as the information handling system 500 as shown in FIG. 5. The information handling system 500 includes a central processing unit 504, a random access memory 532, and a system bus 530 for communicatively coupling the central processing unit 504 and the random access memory 532. The information handling system 500 includes a device formed by the steps shown in FIGS. 4A–4F, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals.

The present invention has been described with reference to particular embodiments. These embodiments are only examples of the invention's application and should not be taken as a limitation. Various adaptations and combinations of features of the embodiments disclosed are within the scope of the present invention as defined by the following claims.

What is claimed is:

1. A method for depositing solder on the pads of a semiconductor device comprising the steps of:
   depositing bond limiting metallization on the semiconductor device;
   placing a mask on a surface of the semiconductor device;
   forming openings in the mask corresponding to at least two pads of the semiconductor device;
   depositing solder in the openings of the mask and over the bond limiting metallization; and
   scrubbing mask and solder deposited on the pads to a substantially uniform height.

2. The method of claim 1 wherein the step of forming the openings includes the step of forming openings having approximately the same volume.

3. The method of claim 1 wherein the step of forming the openings includes the step of forming openings associated with each pad, the openings having approximately the same area as the pad.

4. The method of claim 1 further comprising the step of removing the mask.

5. The method of claim 4 wherein the step of removing the mask includes the step of etching with a dry etch.

6. The method of claim 5 wherein the bond limiting metallization under the mask is also removed.

7. The method of claim 4 wherein the step of removing the mask includes the step of etching with a wet etch.

8. The method of claim 7, and wherein the bond limiting metallization under the mask is also removed.

9. The method of claim 4 further comprising the step of reflowing the solder to form substantially uniform solder balls on each pad.

10. The method of claim 1 wherein the semiconductor device is a wafer which includes a plurality of chips.

11. The method of claim 10 further comprising the step of dicing the wafer to form a plurality of individual chips.

12. A method for depositing conductive material on the pads of a semiconductor device comprising the steps of:

depositing bond limiting metallization on the semiconductor device;

placing a mask on the semiconductor device;

forming openings in the mask corresponding to at least two pads of the semiconductor device;

depositing conductive material on the pads; and scrubbing mask and conductive material deposited on the pads to a substantially uniform height.

13. A method for depositing conductive material on the pads of a semiconductor device, the method comprising:

depositing bond limiting metallization over the pads;

forming a mask over the bond limiting metallization;

forming openings in the mask over at least two pads;

depositing conductive material in the formed openings and on the at least two pads; and removing a portion of the mask and deposited conductive material and forming a substantially planar surface of the mask and conductive material; and removing the mask.

* * * * *

UNITED STATES PATENT AND TRADEMARK OFFICE
CERTIFICATE OF CORRECTION

PATENT NO. : 6,306,748 B1  
DATED : October 23, 2001  
INVENTOR(S) : Boettcher

Page 1 of 1

It is certified that error appears in the above-identified patent and that said Letters Patent is hereby corrected as shown below:

<u>Title page,</u>  
ABSTRACT,  
Line 13, "soldier" should read -- solder --.

Signed and Sealed this

Twenty-sixth Day of March, 2002

*Attest:*

JAMES E. ROGAN  
*Director of the United States Patent and Trademark Office*

*Attesting Officer*